(12) United States Patent
Peng et al.

(10) Patent No.: US 10,468,310 B2
(45) Date of Patent: Nov. 5, 2019

(54) SPACER INTEGRATION SCHEME FOR FNET AND PFET DEVICES

(71) Applicant: GLOBALFOUNDRIES INC., Grand Cayman (KY)

(72) Inventors: Jianwei Peng, Latham, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/334,964

(22) Filed: Oct. 26, 2016

(65) Prior Publication Data

US 2018/0114730 A1 Apr. 26, 2018

(51) Int. Cl.
*H01L 21/8238* (2006.01)
*H01L 21/762* (2006.01)
*H01L 27/092* (2006.01)

(52) U.S. Cl.
CPC ........ *H01L 21/823821* (2013.01); *H01L 21/76202* (2013.01); *H01L 21/823807* (2013.01); *H01L 27/0924* (2013.01)

(58) Field of Classification Search
CPC .......... H01L 21/823821; H01L 21/845; H01L 27/10826; H01L 27/10879; H01L 27/1211; H01L 21/823878; H01L 21/0217; H01L 21/02532; H01L 21/02238; H01L 21/76202; H01L 21/02164; H01L 27/0924
See application file for complete search history.

(56) References Cited

U.S. PATENT DOCUMENTS

| | | | |
|---|---|---|---|
| 9,054,189 B1 | 6/2015 | Kim et al. | |
| 9,627,382 B2 * | 4/2017 | Cheng | H01L 27/092 |
| 9,653,593 B2 * | 5/2017 | Pawlak | H01L 29/78 |
| 9,685,380 B2 * | 6/2017 | Loubet | H01L 21/823807 |
| 2013/0126951 A1 | 5/2013 | Pawlak | |
| 2013/0334614 A1 * | 12/2013 | Liaw | H01L 21/823821 |
| | | | 257/401 |
| 2015/0145048 A1 | 5/2015 | Cheng et al. | |
| 2016/0225673 A1 * | 8/2016 | Niimi | H01L 21/823807 |
| 2016/0240535 A1 | 8/2016 | Cheng et al. | |

(Continued)

FOREIGN PATENT DOCUMENTS

| TW | 201521095 A | 6/2015 |
|---|---|---|
| TW | 201601218 A | 1/2016 |
| TW | 201626571 A | 7/2016 |

OTHER PUBLICATIONS

Taiwanese Office Action in related Taiwanese Application No. 106119471 dated Mar. 16, 2018, 5 pages.

(Continued)

*Primary Examiner* — Jasmine J Clark
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to a spacer integration scheme for both NFET and PFET devices and methods of manufacture. The structure includes: a plurality of epitaxial grown fin structures for NFET devices having sidewall spacers of a first dimension; and a plurality epitaxial grown fin structures for PFET devices having sidewall spacers of the first dimension.

15 Claims, 4 Drawing Sheets

(56) References Cited

U.S. PATENT DOCUMENTS

2016/0268378 A1  9/2016  Hashemi et al.
2017/0154900 A1* 6/2017  Liu .................... H01L 27/1211

OTHER PUBLICATIONS

Taiwanese Office Action in related Taiwanese Application No. 106119471 dated Jul. 20, 2018, 8 pages.
Taiwanese Office Action and Search Report in related Taiwanese Application No. 106119471 dated Jan. 29, 2019, 9 pages.

* cited by examiner

SPACER INTEGRATION SCHEME FOR FNET AND PFET DEVICES

FIELD OF THE INVENTION

The present disclosure relates to semiconductor structures and, more particularly, to a spacer integration scheme for both NFET and PFET devices and methods of manufacture.

BACKGROUND

FinFETs provide superior levels of scalability and increased levels of integration within integrated circuits. The FinFET, for example, also provides improved electrical control over the channel conduction and reduced leakage current levels. Moreover, the FinFET can overcome some other short-channel effects. In addition, FinFETs can provide lower power consumption which allows high integration levels, operation at lower voltage as a result of their lower threshold voltage and, often, increase operating speeds compared to planar devices.

As the FinFET scales down, it is critical to control the spacer thickness between NFET and PFET devices. For example, an increased spacer thickness on one type of device may effectively limit the scaling of the entire device structure. This poses a problem in current technology nodes and beyond, in which process of record fabrication processes require spacer deposition to protect PFET devices during epitaxy processes, leading to an increased spacer thickness for the PFET device. That is, the additional spacer leads to different spacer thickness between the NFET device and the PFET device. This additional spacer thickness which requires additional space between devices becomes ever more critical in advanced technology nodes that have limited space between devices.

SUMMARY

In an aspect of the disclosure, a structure comprises: a plurality of epitaxial grown fin structures for NFET devices having sidewall spacers of a first dimension; and a plurality epitaxial grown fin structures for PFET devices having sidewall spacers of the first dimension.

In an aspect of the disclosure, a method comprises: forming a plurality of epitaxial grown fin structures on a first side of a substrate, while protecting fin structures on a second side of the substrate; forming sidewall spacers on the epitaxial grown fin structures on the first side of the substrate, while protecting the fin structures on the second side of the substrate; removing the fin structures on the second side of the substrate, while protecting the epitaxial grown fin structures on the first side of the substrate; forming a plurality of epitaxial grown fin structures on the second side of the substrate at locations of the removed fin structures, while protecting the epitaxial grown fin structures on the first side of the substrate; and forming sidewall spacers on the epitaxial grown fin structures on the second side of the substrate, while protecting the epitaxial grown fin structures of on the first side of the substrate.

In an aspect of the disclosure, a method comprises: depositing amorphous material on a plurality of fin structures formed on a first side of the substrate and a second side of the substrate; protecting the amorphous material on the second side of the substrate while removing the amorphous material on the first side of the substrate; forming an oxidized layer on an exposed surface of the amorphous material; replacing the plurality of fin structures on the first side of the substrate with epitaxial grown fin structures; forming sidewalls on the epitaxial fin structures on the first side of the substrate; protecting the epitaxial fin structures on the first side of the substrate while replacing the plurality of fin structures on the second side of the substrate with epitaxial grown fin structures; and forming sidewalls on the epitaxial fin structures on the second side of the substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a spacer integration scheme for both NFET and PFET devices and methods of manufacture. More specifically and advantageously, the present disclosure provides a spacer integration scheme that offers a same spacer thickness for both NFET and PFET devices. For example, the integration scheme provided herein uses a spacer deposition process resulting in a uniform spacer thickness on both NFET and PFET fin structures, compared to conventional processes which result in different spacer thickness between NFET and PFET devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
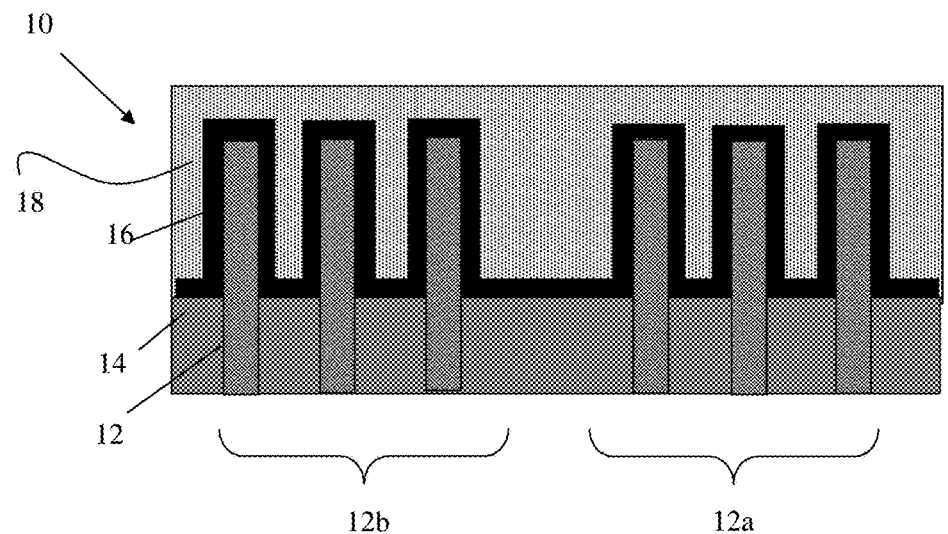
FIG. 1 shows a structure and respective fabrication processes in accordance with aspects of the present disclosure.

FIG. 1 shows a structure and respective fabrication processes in accordance with aspects of the present disclosure. The structure 10 includes a plurality of fin structures 12 formed from either a bulk wafer of Si or other semiconductor material or a silicon-on-insulator (SOI) substrate. For example, in embodiments, the plurality of fin structures 12 can be formed from any suitable semiconductor material including, but not limited to, Si, SiGe, SiGeC, SiC, GaAs, InAs, InP, and other III/V or II/VI compound semiconductors. Shallow trench isolation (STI) regions 14 (e.g., oxide material) can be formed between the fin structures 12, using conventional CMOS processes.

In embodiments, the plurality of fin structures 12 can be formed by conventional sidewall image transfer (SIT) techniques. In the SIT technique, for example, a mandrel material, e.g., $SiO_2$, is formed on the semiconductor material using conventional deposition processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 12. Spacers are formed on the sidewalls of the mandrels which are preferably material that is different than the mandrels, and which are formed using conventional deposition processes. The spacers can have a width which matches the dimensions of the fin structures 12, for example. The mandrels are removed or stripped using a conventional etching process, selective to the mandrel material. An etching is then performed within the spacing of the spacers to form the sub-lithographic features, e.g., fin structures 12. The sidewall spacers can then be stripped.

Still referring to FIG. 1, a spacer material 16 is deposited on the exposed surfaces of the fin structures 12 and STI regions 14. In embodiments, the spacer material 16 is a low-k dielectric material, e.g., SiCON, amongst different materials. The spacer material 16 is deposited by a conventional deposition process, e.g., Atomic Layer Deposition (ALD). The thickness of the spacer material 16 can be about 1 nm to about 40 nm; although other dimensions are contemplated herein.

An amorphous Si (a-Si) material 18 is deposited on the spacer material 16 using a conventional chemical vapor deposition (CVD) process. The a-Si material 18 can be planarized using a chemical mechanical polishing (CMP) process known to those of skill in the art. In embodiments, the amorphous Si (a-Si) material 18 will act as a mask to separate the NFET and PFET junction formation processes between sides 12a, 12b shown in FIG. 1 and as further described herein. More specifically, the integration scheme will utilize the a-Si as the mask to separate the NFET and PFET junction formation processes, making use of the superior etch selective between Si and the hardmask materials, e.g., oxide, nitride or oxynitride.

Figure 2:
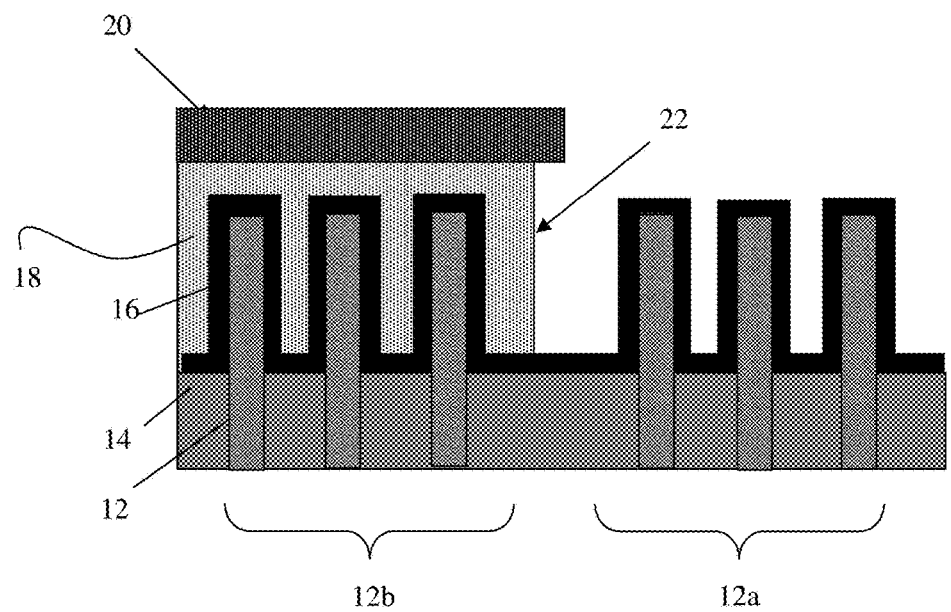
FIG. 2 shows exposed fin structures, amongst other features, and respective fabrication processes in accordance with aspects of the present disclosure.

In FIG. 2, a hardmask material 20 is deposited on the a-Si material 18. In embodiments, the hardmask material 20 is preferably a different material than the spacer material 16. For example, the hardmask material 20 can be SiN deposited using a conventional deposition process, e.g., CVD. The hardmask material 20 and a-Si material 18 can then be removed on side 12a of the structure (e.g., PFET side) using conventional lithography and etching processes. For example, a resist formed over the hardmask material 20 is exposed to energy (light) to form a pattern (opening) corresponding to the fin structures 12 on the PFET side 12a of the structure. A reactive ion etching (RIE) is performed with a chemistry (or chemistries) selective to etch or remove the hardmask material 20 and a-Si material 18 on the PFET side 12a of the structure. In embodiments, the spacer material 16 will act as an etch stop layer during this etching process.

Following the removal of the hardmask material 20, an additional etching process is used to form a recess 22 of the a-Si material 18 under the hardmask material 20, on side 12b of the structure (e.g., NFET side). In embodiments, the etching process is an isotropic etching process which will form a recess of about 2 nm to about 5 nm under the hardmask material 20, e.g., remove about 2 nm to about 5 nm of a-Si material 18 under the hardmask material 20. The resist can be removed using conventional stripants or oxygen ashing techniques.

Figure 3:
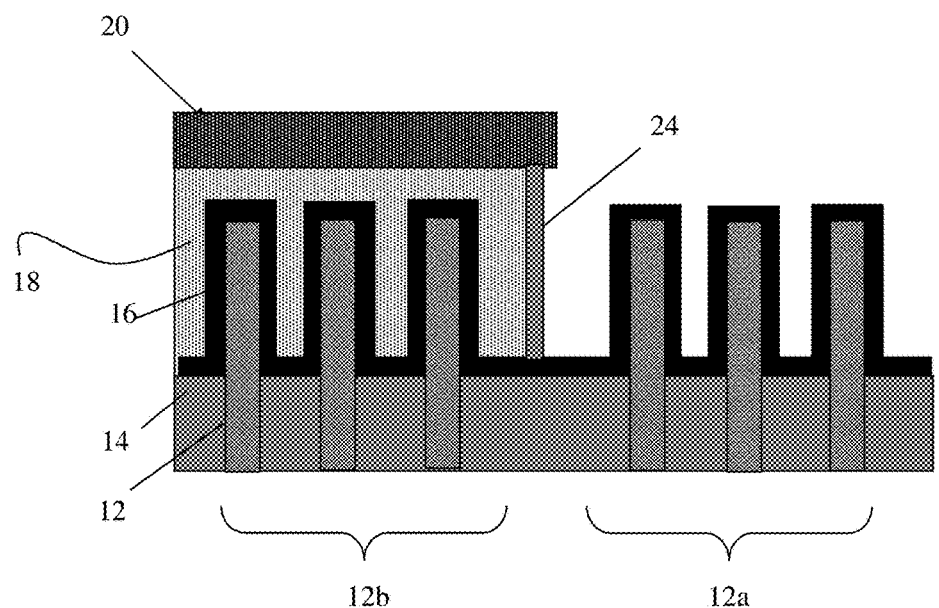
FIG. 3 shows a sidewall structure formed on an exposed surface of a-Si material, amongst other features, and respective fabrication processes in accordance with aspects of the present disclosure.

As shown in FIG. 3, a sidewall 24 is formed on the exposed a-Si material 18 under the hardmask material 20. The sidewall 24 is intentionally embedded below the hardmask material 20 to protect it from damage during subsequent RIE processes. In embodiments, the sidewall 24 is an oxide material formed by an a-Si oxidation process.

For example, the a-Si oxidation process includes placing the structure in an oxygen furnace at low temperature followed by a rapid thermal anneal (RTA) process. In embodiments, the low temperature process can be below 700° C. and preferably between about 600° C. to about 700° C.

Figure 4:
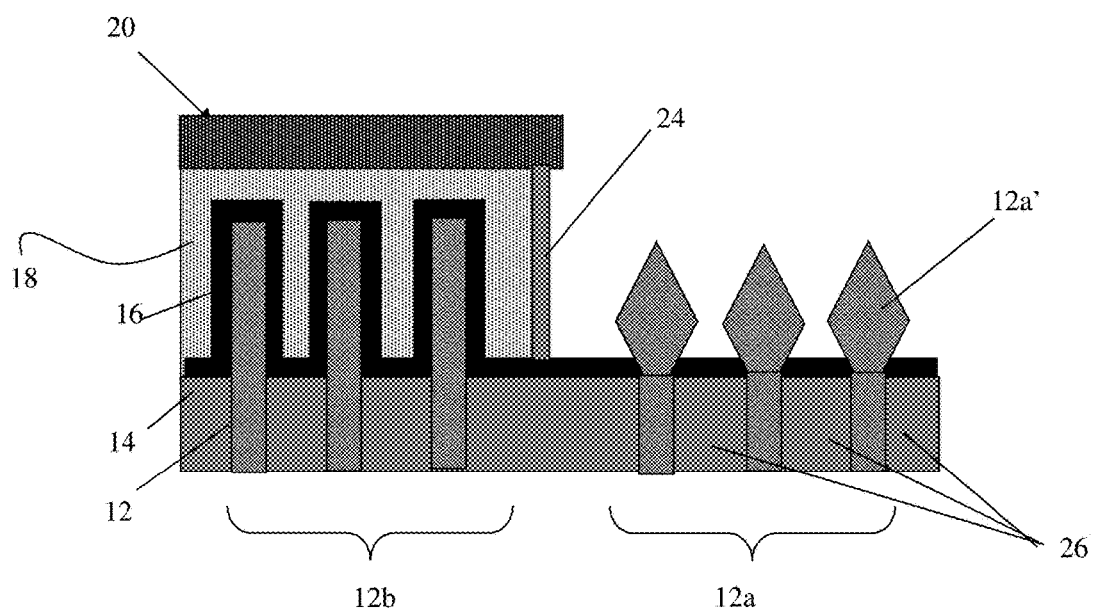
FIG. 4 shows epitaxial fin structures on a first side of a device structure, amongst other features, and respective fabrication processes in accordance with aspects of the present disclosure.

In FIG. 4, the exposed fin structures 12 on the PFET side 12a can be removed, followed by an epitaxial growth process to form PFET fin structures. For example, in embodiments, the exposed fin structures 12 can be removed by a conventional RIE process with chemistries selective to the spacer material 16 and exposed portions of the fin structures 12. In this step, the sidewall 24 will protect the structures on the NFET side 12b.

Following the removal of the exposed portions of the fin structures 12, an epitaxial growth process, e.g., epitaxial SiGe growth process, is utilized to form epitaxial fin structures 12a' on the first side. During this growth process, the oxidized sidewall 24 will prevent epitaxial growth on the a-Si material 18. In embodiments, the epitaxial fin structures 12a' can be used for PFET devices (formed by appropriate doping or ion implantation processes as is known in the art). A PFET source and drain implantation is performed to form source and drain regions 26 for the now formed the epitaxial fin structures 12a'.

Figure 5:
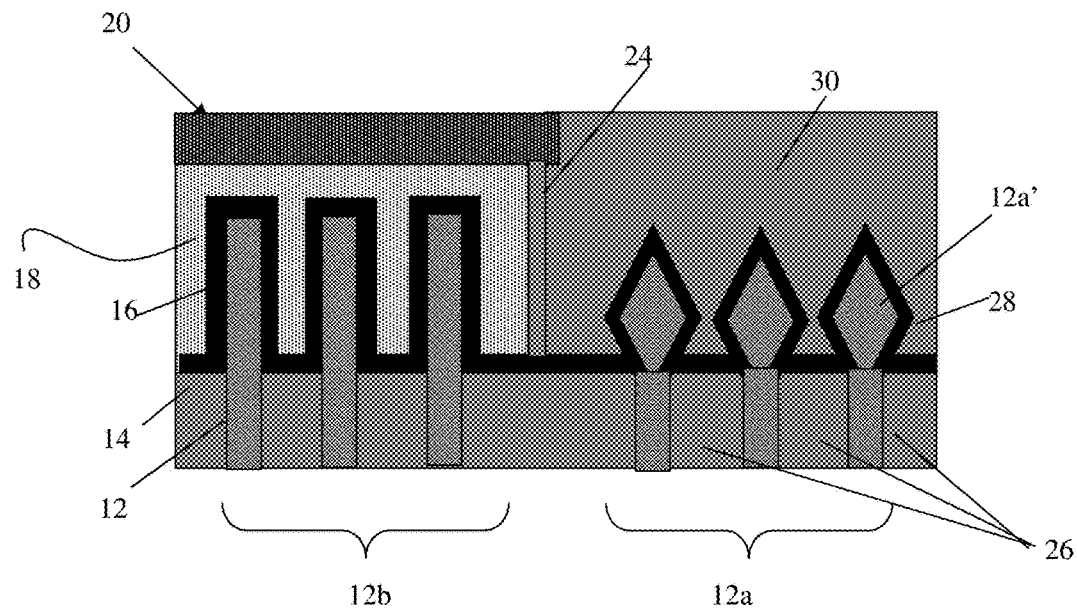
FIG. 5 shows spacers and interlevel dielectric material on the epitaxial fin structures, amongst other features, and respective fabrication processes in accordance with aspects of the present disclosure.

As shown in FIG. 5, a spacer material 28 is deposited on the exposed surfaces of the epitaxial fin structures 12a'. In embodiments, the spacer material 28 is a low-k dielectric material, e.g., SiN, deposited by a conventional deposition process, e.g., ALD. The thickness of the spacer material 28 can be about 1 nm to about 40 nm; although other dimensions are contemplated herein. An interlevel dielectric material 30, e.g., $SiO_2$, is deposited on the spacer material 28 using a conventional CVD process. The interlevel dielectric material 30 can be planarized using a CMP process. In embodiments, the interlevel dielectric material 30 will be planarized to a level of the hardmask material 20 on the NFET side 12b.

Figure 6:
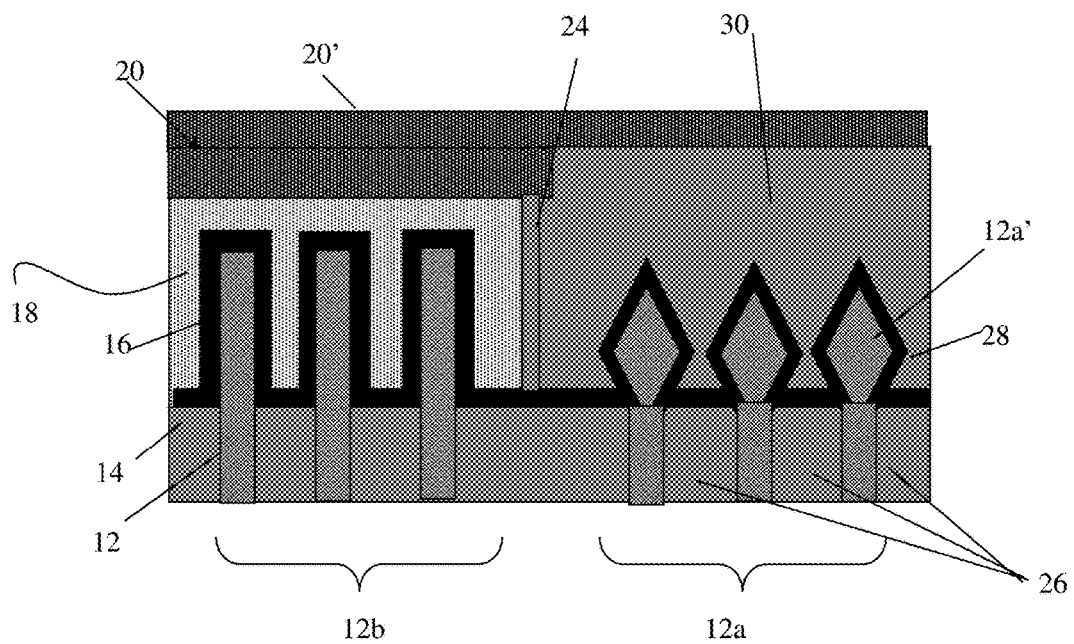
FIG. 6 shows a hardmask on the interlevel dielectric material, amongst other features, and respective fabrication processes in accordance with aspects of the present disclosure.

In FIG. 6, a hardmask 20' is deposited on the exposed surfaces of the interlevel dielectric material 30, e.g., $SiO_2$, and hardmask material 20. In embodiments, the hardmask mask 20' can be deposited using a conventional deposition process, e.g., CVD, and could be the same material as the hardmask 20, e.g., SiN. The hardmask material 20' will be thinner on the PFET side 12a than the combination of the hardmask masks 20, 20' on the NFET side 12b.

Figure 7:
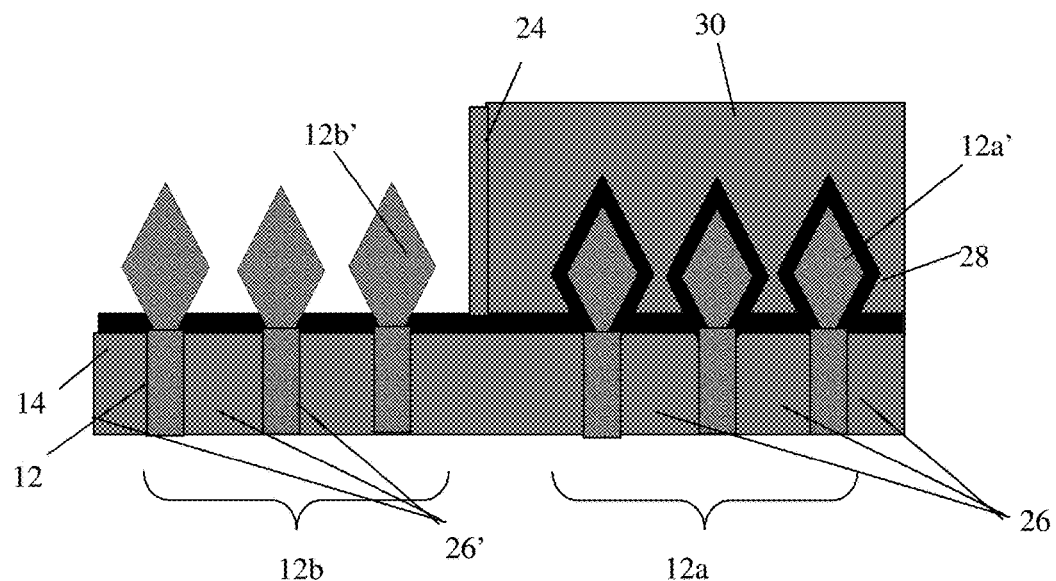
FIG. 7 shows epitaxial fin structures on a second side of the device structure, amongst other features, and respective fabrication processes in accordance with aspects of the present disclosure.

As shown in FIG. 7, the hardmask 20', 20 is removed from the NFET side 12b and the hardmask 20' is removed from the PFET side 12a, followed by the removal of the a-Si material 18. As the hardmask material 20' is thinner on the PFET side 12a, the additional removal of the hardmask mask 20 on the NFET side 12b will also result in recessing of the interlevel dielectric material 30 to about the level of the sidewall 24. As should be understood, the sidewall 24 could further protect the interlevel dielectric material 30 from etching away during the removal of the a-Si material on the NFET side 12b of the structure. In embodiments, the hardmasks 20', 20 and a-Si material 18 can be removed using conventional etching (RIE) processes as described herein.

As further shown in FIG. 7, the exposed fin structures 12 on the NFET side 12b can be removed by a conventional RIE process, followed by an epitaxial growth process to form epitaxial fin structure 12b' (which are formed into NFET devices by appropriate doping or ion implantation processes as is known in the art). In embodiments, the epitaxial growth process is an epitaxial SiGe growth process. An NFET source and drain implantation is performed to form source and drain regions 26'.

Figure 8:
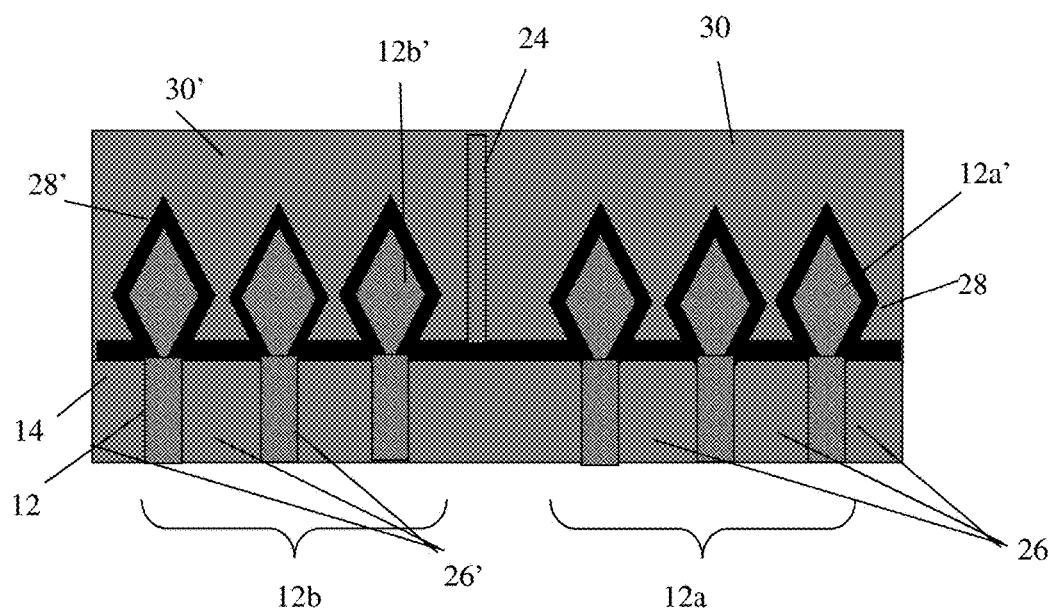
FIG. 8 shows spacers and interlevel dielectric material on the epitaxial fin structures on the second side of the device structure, amongst other features, and respective fabrication processes in accordance with aspects of the present disclosure.

As further shown in FIG. 8, a spacer material 28' is deposited on the exposed surfaces of the epitaxial fin structures 12b'. In embodiments, the spacer material 28' is a low-k dielectric material, e.g., SiN, deposited by a conventional deposition process, e.g., ALD. The thickness of the spacer material 28' is the same as the thickness of the spacer material 28 on the PFET side 12a, e.g., about 1 nm to about 40 nm; although other dimensions are contemplated herein. An interlevel dielectric material 30', e.g., SiO$_2$, is deposited on the spacer material 28 using, e.g., a conventional CVD process. The interlevel dielectric material 30' can be planarized using a CMP.

It should be understood that the process steps described herein can be reversed, such that epitaxial fins and spacers are formed on the NFET side of the structure prior to the PFET side of the structure. In any scenario, though, it is now possible with the spacer integration scheme described herein to form spacers of the same thickness for both NFET and PFET devices. This allows a narrowing of the critical dimension (e.g., spacing) between devices. Also, by implementing the spacer integration scheme described herein, it is possible to eliminate an additional spacer deposition step to protect the PFET device during an epitaxy process, as required in conventional integration schemes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of epitaxial grown fin structures for NFET devices having sidewall spacers; and
   a plurality epitaxial grown fin structures for PFET devices having sidewall spacers of a same dimension as the sidewall spacers for the NFET devices.

2. The structure of claim 1, wherein the plurality of epitaxial grown fin structures for the NFET devices and PFET devices are SiGe fin structures.

3. The structure of claim 1, wherein the sidewall spacers of the epitaxial grown fin structures for the NFET devices and PFET devices are SiN.

4. The structure of claim 1, further comprising an a-Si oxidated sidewall separating the epitaxial grown fin structures for the NFET devices and the epitaxial grown fin structures for the PFET devices.

5. The structure of claim 1, wherein the dimension is about 1 nm to about 40 nm in thickness.

6. The structure of claim 1, wherein the sidewall spacers are a low-k dielectric material, located between the plurality of epitaxial grown fin structures for the NFET devices and the PFET devices.

7. The structure of claim 6, wherein the sidewall spacers are located on a surface of oxide material between the plurality of epitaxial grown fin structures for the NFET devices and the PFET devices.

8. The structure of claim 7, wherein the plurality of epitaxial grown fin structures for the NFET devices and the PFET devices are located on partially etched fin structures.

9. The structure of claim 8, wherein the plurality of epitaxial grown fin structures for the NFET devices and the PFET devices are located directly in contact with the partially etched fin structures.

10. The structure of claim 8, wherein the partially etched fin structures are semiconductor material.

11. The structure of claim 10, wherein the partially etched fin structures are separated by the oxide material.

12. The structure of claim 11, wherein the oxide material are shallow trench isolation regions.

13. The structure of claim 12, wherein the plurality of epitaxial grown fin structures for the NFET devices and the PFET devices are covered with interlevel dielectric material.

14. The structure of claim 13, further comprising an oxidized sidewall separating the interlevel dielectric material covering the epitaxial grown fin structures for the NFET devices and the PFET devices.

15. The structure of claim 1, wherein the sidewall spacers are deposited on exposed surfaces of the epitaxial grown fin structures for the PFET devices and exposed surfaces of the epitaxial grown fin structures for the NFET devices.

* * * * *